United States Patent
Wynar et al.

(10) Patent No.: US 9,814,128 B1
(45) Date of Patent: Nov. 7, 2017

(54) MULTIPLE BOARD STANDOFF

(71) Applicant: Crestron Electronics, Inc., Rockleigh, NJ (US)

(72) Inventors: Agnieszka Wynar, Wallington, NJ (US); Stan Wisniewski, Pompton Plains, NJ (US); Michael Campagna, Woodcliff Lake, NJ (US); Scott Wisniewski, Poughquag, NY (US)

(73) Assignee: Crestron Electronics, Inc., Rockleigh, NJ (US)

( * ) Notice: Subject to any disclaimer, the term of this patent is extended or adjusted under 35 U.S.C. 154(b) by 0 days.

(21) Appl. No.: 15/455,306

(22) Filed: Mar. 10, 2017

(51) Int. Cl.
| H05K 1/00 | (2006.01) |
| H05K 1/02 | (2006.01) |
| H05K 1/14 | (2006.01) |

(52) U.S. Cl.
CPC ............. *H05K 1/02* (2013.01); *H05K 1/144* (2013.01); *H05K 2201/042* (2013.01); *H05K 2201/2036* (2013.01)

(58) Field of Classification Search
CPC .......... H05K 1/02; H05K 1/144; H05K 7/142; H05K 2201/042; H05K 2201/2036; H01R 4/34; H01R 9/18; H01R 12/52; H01R 12/523; Y10T 403/59; Y10T 403/68; Y10T 403/581; Y10T 403/7064; F16B 2/185; F16B 21/09
USPC ...................... 174/250, 113 R, 138 G, 138 D; 248/222.41, 221.12; 361/736, 742, 784, 361/803; 403/316, 374.1
See application file for complete search history.

(56) References Cited

U.S. PATENT DOCUMENTS

| 5,018,982 | A |   | 5/1991 | Speraw et al. |
| 5,963,432 | A | * | 10/1999 | Crowley ............... H05K 7/142 174/138 G |
| 6,038,140 | A |   | 3/2000 | Petri |
| 6,142,435 | A | * | 11/2000 | Lodi ..................... F16B 21/09 248/221.12 |
| 6,347,042 | B1 | * | 2/2002 | White ................... H05K 7/142 174/138 D |
| 6,493,233 | B1 |   | 12/2002 | De Lorenzo et al. |
| 7,744,386 | B1 | * | 6/2010 | Speidel ............... H01R 25/145 439/118 |
| 2004/0062597 | A1 | * | 4/2004 | Gilliland ............... F16B 2/185 403/374.1 |
| 2008/0310138 | A1 |   | 12/2008 | Arends |

* cited by examiner

*Primary Examiner* — Timothy Thompson
*Assistant Examiner* — Guillermo Egoavil
(74) *Attorney, Agent, or Firm* — Crestron Electronics, Inc.

(57) ABSTRACT

A multiple board standoff for interconnecting a plurality of electronic boards, such as printed circuit boards, having at least one keyhole slot. The standoff comprises a plurality of major diameter portions, a plurality of minor diameter portions each disposed between two of the plurality of major diameter portions, and a plurality of abutment surfaces each transversely extending from one of the major diameter portions to one of the minor diameter portions. At least one of the minor diameter portions is configured to be inserted into the keyhole slot when the standoff is in a first orientation with respect to the electronic board and being retained within the keyhole slot when the standoff is in a second orientation with respect to the electronic board.

25 Claims, 9 Drawing Sheets

MULTIPLE BOARD STANDOFF

BACKGROUND OF THE INVENTION

Technical Field

Aspects of the embodiments generally relate to mounting hardware for printed circuit boards, and more specifically to a multiple board standoff for interconnecting a plurality of boards, such as printed circuit boards.

Background Art

Standoffs are utilized to support, space apart, and interconnect various assemblies. In the printed circuit board (PCB) field, standoffs can be used to support and secure a PCB above a chassis or to stack and interconnect a plurality of PCBs to provide sufficient space for the PCB components, insulate the PCBs, and prevent electrical shorts. A typical standoff comprises a tubular or hexagonal body comprising a length that defines the desired separation between the chassis and the PCB or between PCBs. Male or female connections are disposed on the terminal ends of the standoff. The chassis and/or PCBs in turn contain mounting holes for receiving the male terminal ends of the standoff. The standoffs may be secured to the chassis and/or PCBs using nuts, screws, or threaded fasteners.

Multiple male-to-female standoffs can be also used to connect a plurality of PCBs one above another. Existing assemblies for connecting a plurality of PCBs, however, requires a plurality of standoffs, which makes assembly difficult and expensive. Additionally, staggering a plurality of standoffs takes up space on the circuit board and provides a structure containing a plurality points of weakness.

Accordingly, there is a need for a multiple board standoff for interconnecting a plurality of boards, such as PCBs, that provides low cost, easy and short assembly, and takes up less space on the boards than traditional solutions.

SUMMARY OF THE INVENTION

It is an object of the embodiments to substantially solve at least the problems and/or disadvantages discussed above, and to provide at least one or more of the advantages described below.

It is therefore a general aspect of the embodiments to provide systems, methods, and modes for a standoff for interconnecting a plurality of boards, such as PCBs, that will obviate or minimize problems of the type previously described.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Further features and advantages of the aspects of the embodiments, as well as the structure and operation of the various embodiments, are described in detail below with reference to the accompanying drawings. It is noted that the aspects of the embodiments are not limited to the specific embodiments described herein. Such embodiments are presented herein for illustrative purposes only. Additional embodiments will be apparent to persons skilled in the relevant art(s) based on the teachings contained herein.

DISCLOSURE OF INVENTION

According to an aspect of the embodiments, an electronic board mounting assembly is provided comprising an electronic board and a standoff. The electronic board comprises a keyhole slot having a reduced portion extending inwardly from a peripheral edge of the electronic board to an enlarged portion. The standoff comprises a longitudinal body extending from a first terminal end to a second terminal end. The standoff longitudinal body comprises a plurality of major diameter portions, a plurality of minor diameter portions each disposed between two of the plurality of major diameter portions, and a plurality of abutment surfaces each transversely extending from one of the major diameter portions to one of the minor diameter portions. At least one of the minor diameter portions is configured to be inserted through the reduced portion of the keyhole slot and into the enlarged portion of the keyhole slot when the standoff is in a first orientation with respect to the electronic board. The standoff is configured to be rotated to a second orientation with respect to the electronic board in which the at least one minor diameter portion cannot exit the enlarged portion of the keyhole slot through the reduced portion and the electronic board is retained by the standoff between at least two of the abutment surfaces.

According to an embodiment, the standoff further comprises a head portion at the first terminal end or the second terminal end of the longitudinal body of the standoff. The head portion may comprise a drive portion shaped to receive a torque translating tool that is used to rotate the standoff about its longitudinal axis. The drive portion may comprise a single flat slot drive, a cross drive, a Phillips drive, a square drive, a hex socket drive, or the like. According to another embodiment, the head portion may comprise a thumb lock projection extending from a side surface thereof configured to be engaged by a user to rotate the standoff about its longitudinal axis. The head portion may comprise a drop cross sectional shape. The thumb lock projection may extend beyond a diameter of the major diameter portions. The thumb lock projection may form an extended abutment surface between a top major diameter portion and a top minor diameter portion. The electronic board may comprise a depression proximate to the keyhole slot, and wherein the extended abutment surface comprises a projection configured for being received by the depression when the standoff is in the second orientation with respect to the electronic board to lock rotation between the standoff and the keyhole slot.

According to an embodiment, at least one of the major diameter portions comprises an alignment mark that is aligned with the reduced portion of the keyhole slot when the standoff is at the second orientation with respect to the electronic board. The major diameter portions may comprise identical lengths for interconnecting a plurality of electronic boards at identical distances. In another embodiment, the major diameter portions may comprise variable lengths for interconnecting a plurality of electronic boards at variable distances.

According to an embodiment, each minor diameter portion comprises an obround shape defined by two parallel flat surfaces connected by two semicircular surfaces. Each minor diameter portion comprises a first diameter between the two semicircular surfaces and a second diameter between the two parallel flat surfaces. The first and the second diameters are smaller than a diameter of the major diameter portions. The second diameter of each minor diameter portion is smaller than a diameter of the reduced portion of the keyhole slot. The first diameter of each minor diameter portion is larger than the diameter of the reduced portion of the keyhole slot. The first and the second diameters are smaller than a diameter of the enlarged portion of the keyhole slot. The diameter of the enlarged portion is larger than the diameter of the reduced portion of the keyhole slot. The enlarged portion of the keyhole slot may comprise a semicircular shape.

According to a further embodiment, the electronic board comprises at least one depression proximate to the keyhole slot, and wherein at least one of the abutment surfaces comprises at least one projection configured for being received by the depression when the standoff is in the second orientation with respect to the electronic board to lock rotation between the standoff and the keyhole slot. According to another embodiment, the electronic board comprises at least one projection proximate to the keyhole slot, and wherein at least one of the abutment surfaces comprises at least one depression configured for receiving the projection when the standoff is in the second orientation with respect to the electronic board to lock rotation between the standoff and the keyhole slot.

According to another embodiment, each of the minor diameter portions are configured for being received by keyhole slots of a plurality of electronic boards to interconnect the plurality of board in a stacked configuration.

According to another aspect of the embodiments, a standoff is provided for interconnecting a plurality of electronic boards each electronic board comprising a keyhole slot having a reduced portion extending inwardly from a peripheral edge of the electronic board to an enlarged portion. The standoff comprises a plurality of major diameter portions, a plurality of minor diameter portions each disposed between two of the plurality of major diameter portions, and a plurality of abutment surfaces each transversely extending from one of the major diameter portions to one of the minor diameter portions. At least one of the minor diameter portions is configured to be inserted through the reduced portion of the keyhole slot and into the enlarged portion of the keyhole slot when the standoff is in a first orientation with respect to the electronic board. The at least one minor diameter portion is configured to be retained within the enlarged portion of the keyhole slot when the standoff is in a second orientation with respect to the electronic board.

According to a further aspect of the embodiments, an electronic board mounting assembly is provided comprising an electronic board and a standoff. The electronic board comprises a keyhole slot having a reduced portion extending inwardly from a peripheral edge of the electronic board to an enlarged portion. The standoff comprises a longitudinal body comprising a plurality of major diameter portions and a plurality of minor diameter portions. Each minor diameter portion is disposed between two of the plurality of major diameter portions and each comprises an obround shape defined by two parallel flat surfaces connected by two semicircular surfaces, a first diameter between the two semicircular surfaces, and a second diameter between the two parallel flat surfaces. The longitudinal body further comprises a plurality of abutment surfaces each transversely extending from one of the major diameter portions to one of the minor diameter portions. The first diameter of each minor diameter portion is larger than a diameter of the reduced portion of the keyhole slot and wherein the second diameter of each minor diameter portion is smaller than the diameter of the reduced portion of the keyhole slot. At least one minor diameter portion of the standoff is inserted into the keyhole slot of the electronic board to retain the electronic board between at least two of the abutment surfaces.

BRIEF DESCRIPTION OF THE DRAWINGS

The above and other objects and features of the embodiments will become apparent and more readily appreciated from the following description of the embodiments with reference to the following figures. Different aspects of the embodiments are illustrated in reference figures of the drawings. It is intended that the embodiments and figures disclosed herein are to be considered to be illustrative rather than limiting. The components in the drawings are not necessarily drawn to scale, emphasis instead being placed upon clearly illustrating the principles of the aspects of the embodiments. In the drawings, like reference numerals designate corresponding parts throughout the several views.

BRIEF DESCRIPTION OF THE SEVERAL VIEWS OF THE DRAWINGS

Figure 1:
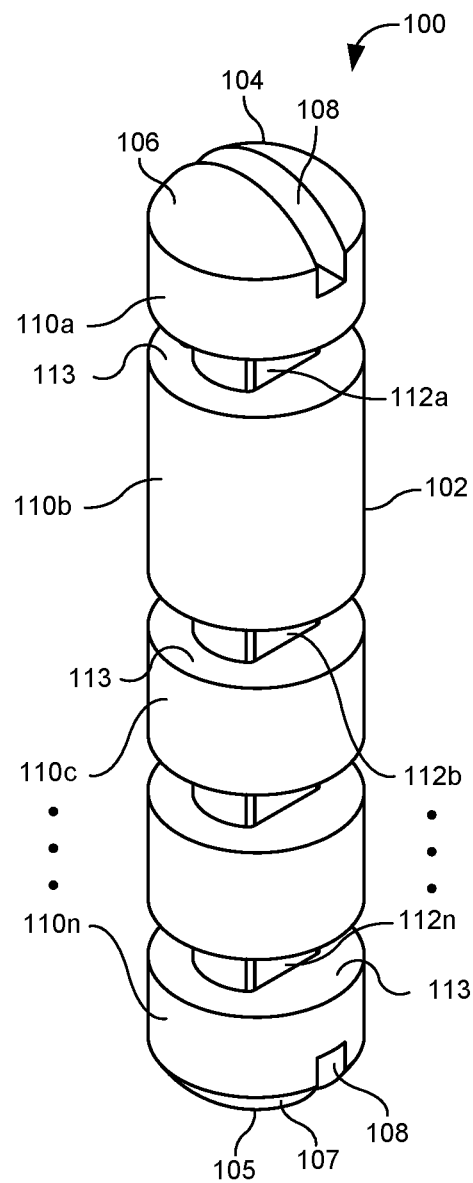

FIG. 1 illustrates a perspective top view of a standoff according to an illustrative aspect of the embodiments.

Figure 2:
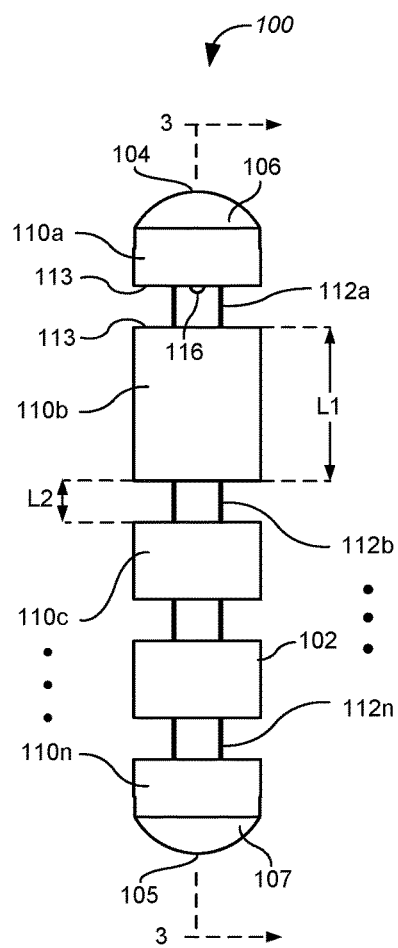

FIG. 2 illustrates a front view of the standoff, which is identical to the rear view thereof, according to an illustrative aspect of the embodiments.

Figure 3:
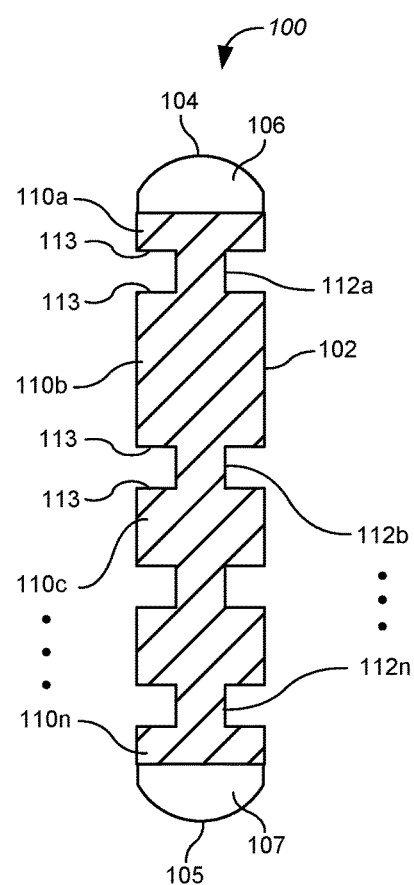

FIG. 3 illustrates a cross sectional front view of the standoff taken along line 3-3 of FIG. 2, according to an illustrative aspect of the embodiments.

Figure 4:
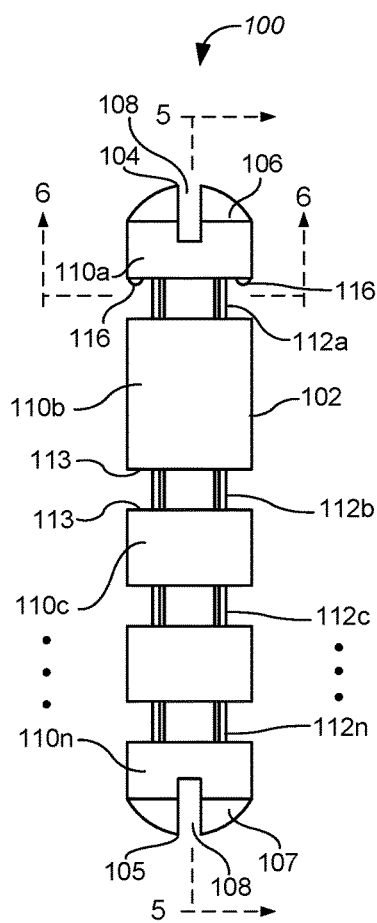

FIG. 4 illustrates a side view of the standoff, which is identical to the opposite side view thereof, according to an illustrative aspect of the embodiments.

Figure 5:
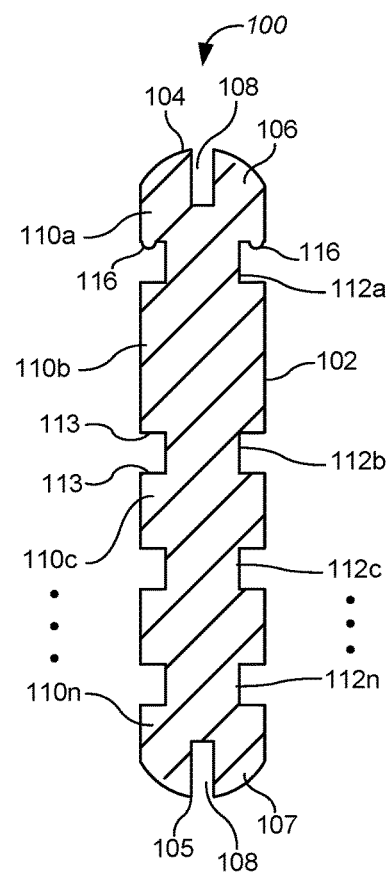

FIG. 5 illustrates a cross sectional side view of the standoff taken along line 5-5 of FIG. 4, according to an illustrative aspect of the embodiments.

Figure 6:
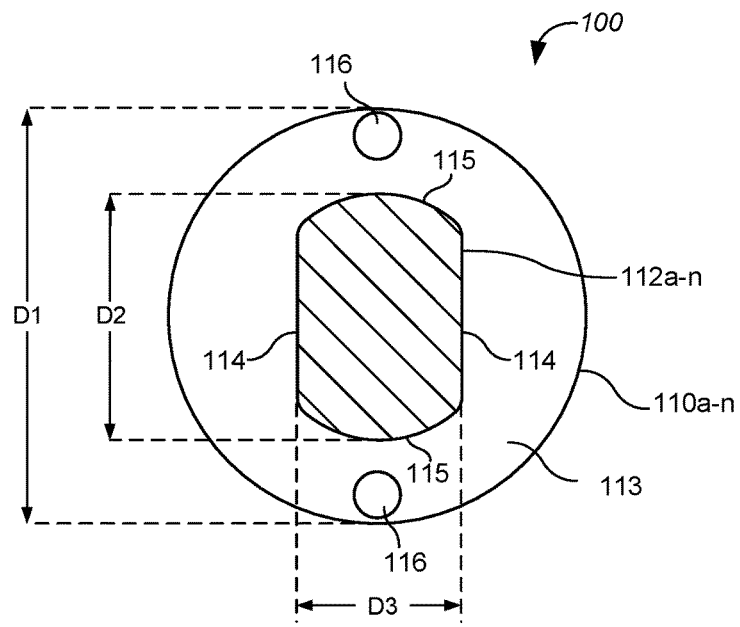

FIG. 6 illustrates a cross-sectional bottom view of the standoff taken along line 6-6 of FIG. 4, according to an illustrative aspect of the embodiments.

Figure 7:
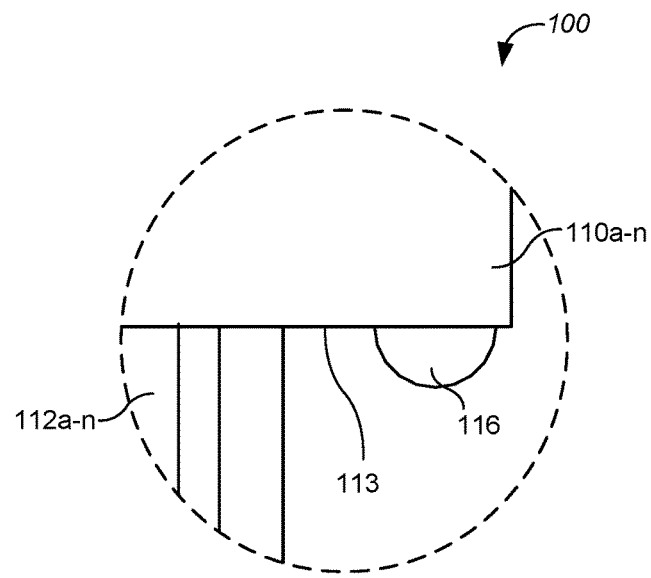

FIG. 7 illustrates a partially cut away side view of the standoff showing a projection extending from an abutment surface in a greater detail, according to an illustrative aspect of the embodiments.

Figure 8:
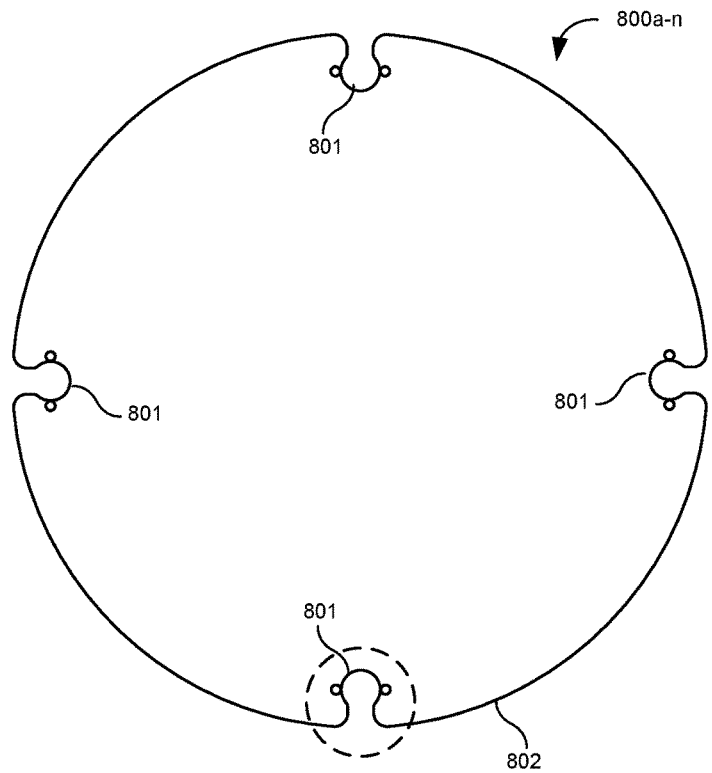

FIG. 8 illustrates a top view of a board according to an illustrative aspect of the embodiments.

Figure 9:
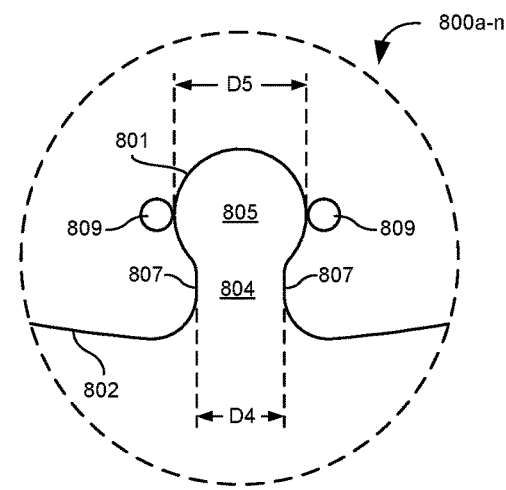

FIG. 9 illustrates a partially cut away top view of the board showing a keyhole slot in a greater detail, according to an illustrative aspect of the embodiments.

Figure 10A:
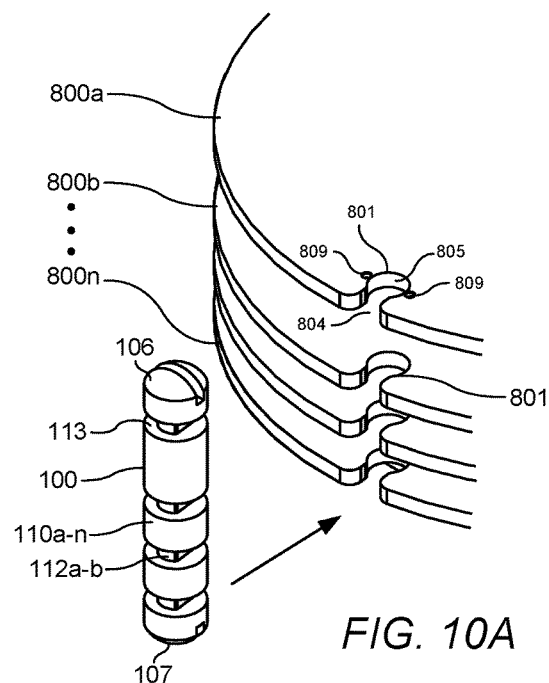

FIG. 10A illustrates a perspective top view of the standoff and a plurality of boards in a disconnected position, according to an illustrative aspect of the embodiments.

Figure 10B:
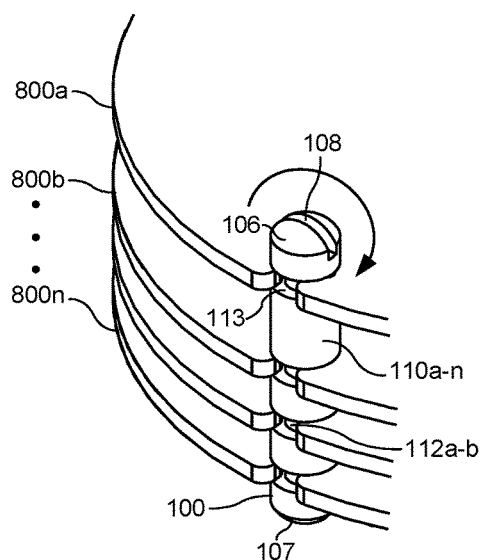

FIG. 10B illustrates a perspective top view of the standoff inserted into the keyhole slots of the plurality of boards, according to an illustrative aspect of the embodiments.

Figure 10C:
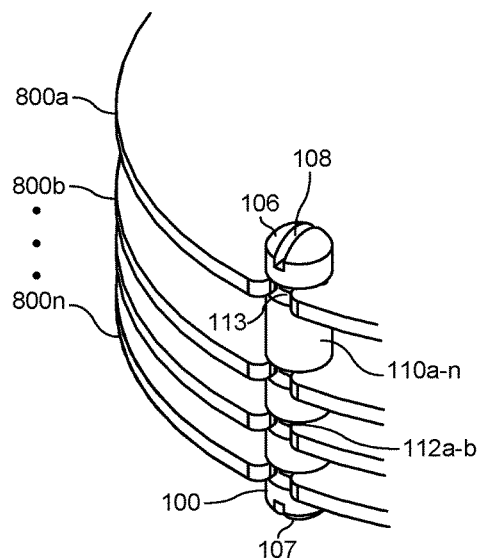

FIG. 10C illustrates a perspective top view of the standoff rotated within the keyhole slots of the plurality of boards, according to an illustrative aspect of the embodiments.

Figure 11A:
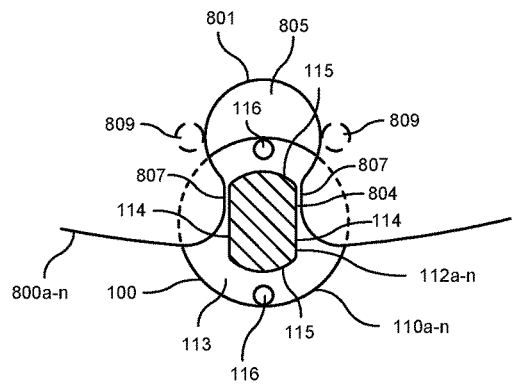

FIG. 11A illustrates a bottom view of a board and a cross-sectional bottom view of the standoff taken along line 6-6 of FIG. 4, the standoff being partially inserted in the keyhole slot of the board, according to an illustrative aspect of the embodiments.

Figure 11B:
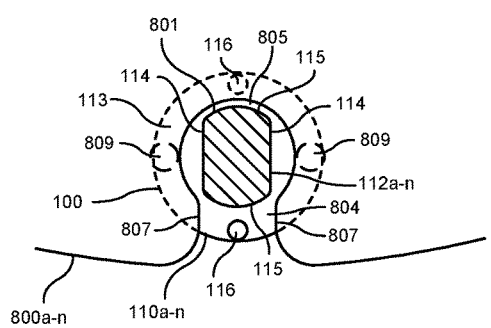

FIG. 11B illustrates a bottom view of a board and a cross-sectional bottom view of the standoff taken along line 6-6 of FIG. 4, the standoff being fully inserted in the keyhole slot of the board, according to an illustrative aspect of the embodiments.

Figure 11C:
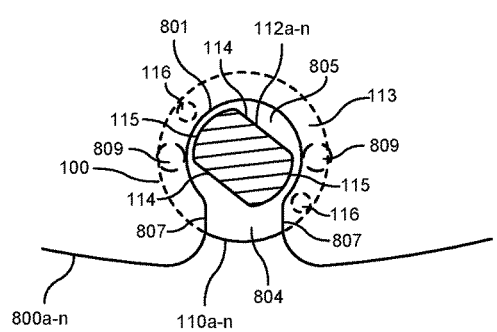

FIG. 11C illustrates a bottom view of a board and a cross-sectional bottom view of the standoff taken along line 6-6 of FIG. 4, the standoff being partially rotated within the keyhole slot of the board, according to an illustrative aspect of the embodiments.

Figure 11D:
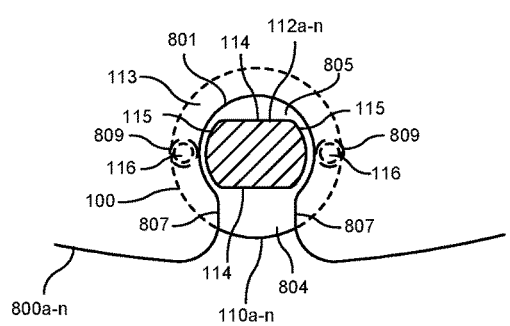

FIG. 11D illustrates a bottom view of a board and a cross-sectional bottom view of the standoff taken along line 6-6 of FIG. 4, the standoff being fully rotated within the keyhole slot of the board, according to an illustrative aspect of the embodiments.

Figure 12A:
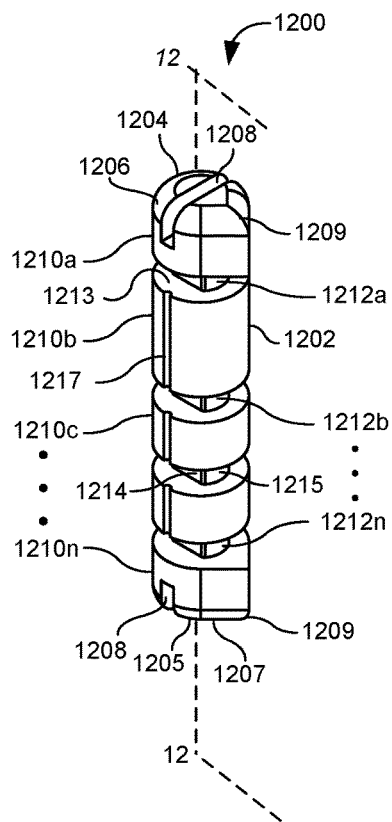

FIG. 12A illustrates a perspective top view of a standoff according to another illustrative aspect of the embodiments.

Figure 12B:
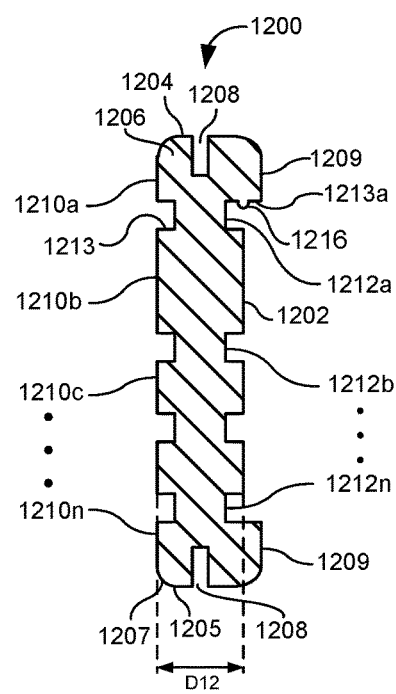

FIG. 12B illustrates a cross sectional side view of the standoff taken along line 12-12 of FIG. 12A, which is a mirror image of the opposite side view thereof, according to another illustrative aspect of the embodiments.

Figure 12C:
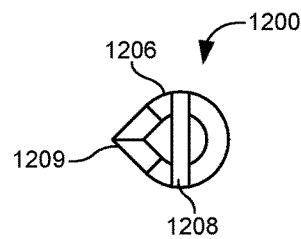

FIG. 12C illustrates a top view of the standoff, which is a mirror image of the bottom view thereof, according to another illustrative aspect of the embodiments.

Figure 13A:
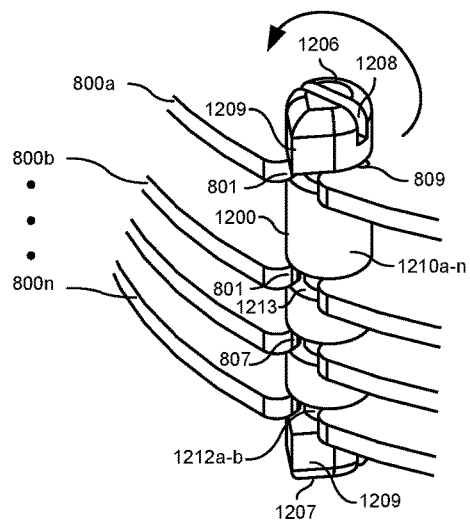

FIG. 13A illustrates a perspective top view of the standoff inserted into the keyhole slots of the plurality of boards, according to an illustrative aspect of the embodiments.

Figure 13B:
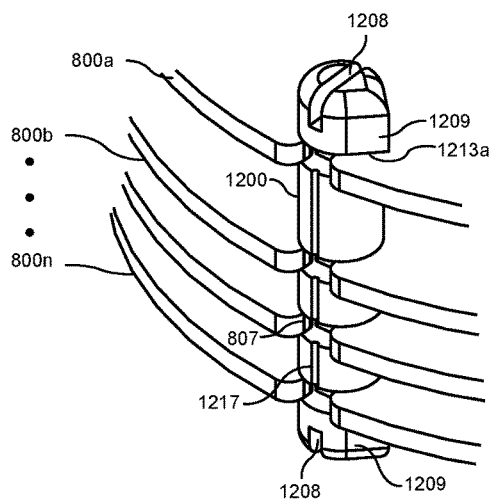

FIG. 13B illustrates a perspective top view of the standoff rotated within the keyhole slots of the plurality of boards, according to an illustrative aspect of the embodiments.

DETAILED DESCRIPTION OF THE INVENTION

The embodiments are described more fully hereinafter with reference to the accompanying drawings, in which embodiments of the inventive concept are shown. In the drawings, the size and relative sizes of layers and regions may be exaggerated for clarity. Like numbers refer to like elements throughout. The embodiments may, however, be embodied in many different forms and should not be construed as limited to the embodiments set forth herein. Rather, these embodiments are provided so that this disclosure will be thorough and complete, and will fully convey the scope of the inventive concept to those skilled in the art. The scope of the embodiments is therefore defined by the appended claims. The detailed description that follows is written from the point of view of a control systems company, so it is to be understood that generally the concepts discussed herein are applicable to various subsystems and not limited to only a particular controlled device or class of devices described herein.

Reference throughout the specification to "one embodiment" or "an embodiment" means that a particular feature, structure, or characteristic described in connection with an embodiment is included in at least one embodiment of the embodiments. Thus, the appearance of the phrases "in one embodiment" on "in an embodiment" in various places throughout the specification is not necessarily referring to the same embodiment. Further, the particular feature, structures, or characteristics may be combined in any suitable manner in one or more embodiments.

LIST OF REFERENCE NUMBERS FOR THE ELEMENTS IN THE DRAWINGS IN NUMERICAL ORDER

The following is a list of the major elements in the drawings in numerical order.
100 Standoff
102 Longitudinal Body
104 First Terminal End
105 Second Terminal End
106 First Head Portion
107 Second Head Portion
108 Drive Portions
110a-n Major Diameter Portions
112a-n Minor Diameter Portions
113 Abutment Surfaces
114 Flat Surfaces
115 Semicircular Surfaces
116 Projections
800a-n Boards
801 Keyhole Slot
802 Peripheral Edge
804 Reduced Portion
805 Enlarged Portion
807 Side Surfaces
809 Depressions
1200 Standoff
1202 Longitudinal Body
1204 First Terminal End
1205 Second Terminal End
1206 First Head Portion
1207 Second Head Portion
1208 Drive Portions
1209 Thumb Lock Projection
1210a-n Major Diameter Portions
1212a-n Minor Diameter Portions
1213 Abutment Surfaces
1213a Extended Abutment Surface
1214 Flat Surfaces
1215 Semicircular Surfaces
1216 Projections
1217 Alignment Mark List of Acronyms Used in the Specification in Alphabetical Order The following is a list of the acronyms used in the specification in alphabetical order.
D1 Diameter of a Major Diameter Portion
D2 First Diameter Between Two Parallel Semicircular Surfaces of the Minor Diameter Portion
D3 Second Diameter Between Two Parallel Flat Surfaces of the Minor Diameter Portion
D4 Entrance Diameter of the Reduced Portion of the Keyhole Slot
D5 Diameter of the Enlarged Portion of the Keyhole Slot
D12 Diameter of a Major Diameter Portion
L1 Length of a Major Diameter Portion
L2 Length of a Minor Diameter Portion
PCB Printed Circuit Board

MODE(S) FOR CARRYING OUT THE INVENTION

For 40 years Crestron Electronics, Inc. has been the world's leading manufacturer of advanced control and automation systems, innovating technology to simplify and enhance modern lifestyles and businesses. Crestron designs, manufactures, and offers for sale integrated solutions to control audio, video, computer, and environmental systems. In addition, the devices and systems offered by Crestron streamlines technology, improving the quality of life in commercial buildings, universities, hotels, hospitals, and homes, among other locations. Accordingly, the systems, methods, and modes of the aspects of the embodiments described herein can be manufactured by Crestron Electronics Inc., located in Rockleigh, N.J.

The different aspects of the embodiments described herein pertain to the context of a multiple board standoff for interconnecting a plurality of boards, such as printed circuit boards (PCBs), but is not limited thereto, except as may be set forth expressly in the appended claims. While the standoff of the present embodiments is described below as interconnecting a plurality of PCBs, the standoff can be utilized for any product that has a need to interconnect multiple boards, plates, slabs, or the like, collectively referred to herein as "boards".

The multiple board standoff assembly of the present embodiments provides low cost, easy and short assembly, and takes up less space on the boards than traditional solutions. The multiple board standoff of the present embodiments allows the connection of multiple boards with a single part.

Referring to FIGS. 1-5, there is shown an illustrative multiple board standoff 100 according to an aspect of the present embodiments. Particularly, FIG. 1 illustrates a perspective top view of the standoff 100; FIG. 2 illustrates a front view of the standoff 100, which is identical to the rear view thereof; FIG. 3 illustrates a cross sectional front view of the standoff 100 taken along line 3-3 of FIG. 2; FIG. 4 illustrates a side view of the standoff 100, which is identical to the opposite side view thereof; and FIG. 5 illustrates a cross sectional side view of the standoff 100 taken along line 5-5 of FIG. 4.

The standoff 100 comprises a longitudinal body 102 longitudinally extending from a first terminal end 104 to a second terminal end 105. In an illustrative embodiment, the longitudinal body 102 can be fabricated from plastic. Alternatively, other materials may be used, such as metal, glass, a composite material, or the like.

The standoff 100 may comprise a first head portion 106 at the first terminal end 104 and a second head portion 107 at the second terminal end 105. Each of the first and second head portions 106, 107 may comprise a dome head shape. Although other head shapes may be utilized, such as a pan head, a round head, a mushroom head, a flat head, a countersunk head, an oval head, a flanged head, or the like. Each of the first and second head portions 106, 107 may further comprise a drive portion 108 shaped to receive a torque translating tool, such as a screwdriver, that is used to turn the standoff 100 about its longitudinal axis. According to an embodiment, as shown in FIG. 1, the drive portion 108 may comprise a single flat slot configured for receiving a flat-bladed screwdriver. However, according to various aspects of the embodiments, the drive portion 108 may comprise other commonly known drives, such as a cross drive, a Phillips drive, a square drive, a hex socket drive, or the like. In another embodiment, instead of comprising a female drive portion configured for receiving a male tool, the drive portion 108 may comprise an external or projecting drive configured to be received by a female tool. Although two head portions 106 and 107 are illustrated, each containing a drive portion 108, the standoff 100 may alternatively comprise a single head portion 106 containing a drive portion 108 at the first terminal end 104, and a flat end portion without any drive portion at the second terminal end 105.

The longitudinal body 102 further comprises a plurality of major diameter portions 110a-n and a plurality of minor diameter portions 112a-n disposed between the major diameter portions 110a-n. The number of these portions define how many boards the standoff 100 may interconnect. As an illustrative embodiment, as shown in FIG. 1, the longitudinal body 102 of standoff 100 may comprise five major diameter portions 110a-n and four minor diameter portions 112a-n capable of interconnecting four boards. However, any number of portions may be included depending on the desired number of boards to be connected. Referring to FIG. 2, the length L1 of each major diameter portion 110a-n defines the distance between the secured boards. According to various embodiments, the major diameter portions 110a-n may comprise identical lengths L1 for interconnecting boards at identical distances, or variable lengths L1, as shown in the figures, for interconnecting boards at variable distances. The length L2 of each minor diameter portion 112a-n is equal to or slightly larger than the thickness of the board to be interconnected view the standoff 100.

Each minor diameter portion 112a-n is disposed between two major diameter portions 110a-n and comprises a smaller diameter than the diameter of the major diameter portions 110a-n, thereby forming abutment surfaces 113 therebetween. Each abutment surface 113 transversely extends from at least one major diameter portion 110a-n to at least one minor diameter portion 112a-n.

Each major diameter portion 110a-n may be generally cylindrical in shape, but may comprise other shapes such as a squared shape, a rectangular shape, a hexagonal shape, or the like. The top major diameter portion 110a may be coextensive with the first head portion 106 and the bottom major diameter portion 110n may be coextensive with the second head portion 107.

Referring to FIG. 6, a cross-sectional bottom view of the standoff 100 is shown taken along line 6-6 of FIG. 4. Each major diameter portion 110a-n may comprise diameter D1. The minor diameter portions 112a-n are coextensive with the major diameter portions 110a-n and may each comprise an obround shape defined by two parallel flat surfaces 114 connected by two parallel semicircular surfaces 115. Each minor diameter portion 112a-n may comprise a first diameter D2 between the two parallel semicircular surfaces 115 and a second diameter D3 between the two parallel flat surfaces 114. According to an embodiment, the diameter D1 of the major diameter portion 110a-n is larger than first diameter D2 between the two parallel semicircular surfaces 115 of the minor diameter portion 112a-n, which in turn is larger than second diameter D3 between the two parallel flat surfaces 114 of the minor diameter portion 112a-n.

According to an embodiment, at least one of the abutment surfaces 113 comprises two oppositely disposed projections 116 transversely extending from the abutment surface 113. The projections 116 may be semispherical in shape, but may comprise other shapes known in the art. As shown in FIG. 6, the projections 116 may be disposed on opposite sides of the two parallel semicircular surfaces 115. FIG. 7 illustrates a partially cut away side view of the standoff 100 showing a projection 116 extending from an abutment surface 113 in a greater detail. Referring to FIGS. 4-5, the projections 116 may be disposed on the top major diameter portion 110a, such that the top major diameter portion 110a comprises the first head portion 106 on the top end and the abutment surface 113 containing the projections 116 on the opposite bottom end. According to various embodiment, any one or all of the abutment surfaces 113 may comprise the projections 116.

Referring to FIG. 8, there is shown a top view of one of the boards 800a-n, such as a PCB, for being interconnected via the standoff 100, according to an illustrative embodiment of the invention. According to one embodiment, each board 800a-n may comprise a circular shape, however, any other shape known in the art may be employed, including a square shape, a rectangular shape, or the like. Each board 800a-n may comprise at least one keyhole slot 801 traversing the board 800a-n and extending inwardly from the peripheral edge 802 of the board 800a-n. Each keyhole slot 801 is configured for receiving a minor diameter portion 112a-n of a standoff 100 as will be described below in a greater detail. Each board 800a-n may comprise a plurality of keyhole slots 801 disposed along its peripheral edge 802 for being secured by a plurality of standoffs 100.

FIG. 9 illustrates a partially cut away top view of the board 800a-n showing the keyhole slot 801 in a greater detail. The keyhole slot 801 comprises a reduced portion 804 and an enlarged portion 805. The reduced portion 804 may comprise two oppositely disposed side surfaces 807 extending from the peripheral edge 802 of the board 800a-n to the enlarged portion 805.

The reduced portion 804 of the keyhole slot 801 may comprise an entrance diameter D4. The enlarged portion 805 of the keyhole slot 801 may comprise a semicircular shape comprising diameter D5. According to an embodiment, diameter D5 of the enlarged portion 805 is larger than the entrance diameter D4 of the minor portion 804 of the keyhole slot 801. According to an embodiment, the entrance diameter D4 of the reduced portion 804 of the keyhole slot 801 is equal to or slightly larger than the second diameter D3 between the two parallel flat surfaces 114 of the minor diameter portion 112a-n such that the minor diameter portion 112a-n can be inserted through the reduced portion 804, as will be described below in greater detail. The diameter D5 of the enlarged portion 805 of the keyhole slot 801 is equal to or slightly larger than the first diameter D2 between the two parallel semicircular surfaces 115 of the minor diameter portion 112a-n such that the minor diameter portion 112a-n can freely rotated within the enlarged portion 805, as will be described below in greater detail.

The board 800a-n may further comprise two depressions 809 disposed on opposite sides of the enlarged portion 805 of the keyhole slot 801. According to an embodiment, the depressions 809 are disposed orthogonal to the two side surfaces 807 of the reduced portion 804. The depressions 809 are positioned and sized so as to receive the semispherical projections 116 on the abutment surface 113 of the standoff 100. According to another embodiment, the board 800a-n may comprise the projections 116 and the standoff 100 may comprise the depressions 809.

FIGS. 10A-10C and 11A-11D illustrate a method of interconnecting a plurality of boards 800a-n using the multiple board standoff 100 of the present embodiments, where each FIG. 10A-10C illustrates a perspective top view of a plurality of boards 800a-n and standoff 100 in different positions with respect to each other, and each FIG. 11A-11D illustrates a bottom view of a board 800a-n and a cross-sectional bottom view of the standoff 100, taken along line 6-6 of FIG. 4, in different positions with respect to each other.

Referring to FIG. 10A, the plurality of boards 800a-n are stacked one above another such that the keyhole slots 801 of the boards 800a-n are vertically aligned. As shown in FIGS. 10A and 11A, the standoff 100 is then aligned with the keyhole slots 801 such that the flat surfaces 114 of the minor diameter portions 112a-n are parallel with the side surfaces 807 of the reduced portion 804 of the keyhole slots 801. The standoff 100 is then inserted into the keyhole slots 801 of the boards 800a-n. Particularly, referring to FIG. 11A, each minor diameter portion 112a-n of the standoff 100 is inserted through a reduced portion 804 of a respective keyhole slot 801 of a board 800a-n. Accordingly, the second diameter D3 between the two parallel flat surfaces 114 of the minor diameter portion 112a-n of the standoff 100 is smaller than the entrance diameter D4 of the reduced portion 804 of the keyhole slot 801. Referring to FIG. 10A, each board 800a-n is thereby positioned between respective major diameter portions 110a-n of the standoff 100 and secured between abutment surfaces 113.

Referring to FIGS. 10B and 11B, the standoff 100 is inserted into the keyhole slots 801 of the boards 800a-n until each minor diameter portion 112a-n of the standoff 100 resides within the enlarged portion 805 of a respective keyhole slot 801 of each board 800a-n.

The drive portion 108 of the first head portion 106 or the second head portion 107 is then engaged with a torque translating tool, such as a screwdriver, and rotated by about 90 degrees, as shown in FIGS. 10B-10C and 11B-11D. During rotation, each minor diameter portion 112a-n of the standoff 100 rotates within the enlarged portion 805 of a respective keyhole slot 801 of each board 800a-n. Particularly, the semicircular surfaces 115 of the minor diameter portions 112a-n rotationally translate with respect to the semicircular surfaces of the enlarged portion 805. Accordingly, the first diameter D2 between the two parallel semicircular surfaces 115 of the minor diameter portions 112a-n is smaller than the diameter D5 of the enlarged portion 805 of the keyhole slot 801 of the board 800a-n.

As shown in FIGS. 10C and 11D, after rotating the standoff 100 by about 90 degrees, the flat surfaces 114 of the minor diameter portions 112a-n are orthogonal with respect to the side surfaces 807 of the reduced portion 804 of the keyhole slots 801. Because the first diameter D2 between the two parallel semicircular surfaces 115 of the minor diameter portions 112a-n is larger than the entrance diameter D4 of the reduced portion 804 of the keyhole slot, the minor diameter portions 112a-n cannot exit the enlarged portions 805 of the keyhole slots 801. The boards 800a-n are vertically locked in between the major diameter portions 110a-n via the abutment surfaces 113. Additionally, the two projections 116 located on at least one of the abutment surfaces 113 of the standoff 100 engage at least two depressions 809 located on at least one of the boards 800a-n. The projections 116 and depressions 809 prevent the standoff 100 from rotating within the enlarged portions 805 of the keyhole slots 801 of the boards and dislodging from the boards. Accordingly, the plurality of boards 800a-n are secured above one another via standoff 100. According to an embodiment, a plurality of standoffs 100 may be secured at various locations along the peripheral edges 802 of the plurality of boards 800a-n to provide stability.

Referring to FIGS. 12A-12O, there is shown another embodiment of a multiple board standoff 1200, where FIG. 12A illustrates a perspective top view of the standoff 1200, FIG. 12B illustrates a cross sectional side view of the standoff 1200 taken along line 12-12 of FIG. 12A, which is a mirror image of the opposite side view thereof, and FIG. 12C illustrates a top view of the standoff 1200, which is a mirror image of the bottom view thereof.

The standoff 1200 comprises similar construction as standoff 100, including a longitudinal body 1202 comprising a first head portion 1206 at a first terminal end 1204 and a second head portion 1207 at a second terminal end 1205. The longitudinal body 1202 further comprises a plurality of major diameter portions 1210a-n and a plurality of minor diameter portions 1212a-n disposed between the major diameter portions 1210a-n. Each major diameter portion 1210a-n may be generally cylindrical in shape, or may comprise any of the shapes described above. Each minor diameter portion 1212a-n may comprise an obround shape defined by two parallel flat surfaces 1214 connected by two parallel semicircular surfaces 1215, similar to the obround shape of the minor diameter portions 112a-n shown in FIG. 6. Standoff 1200 may further comprise abutment surfaces 1213, each transversely extending from at least one major diameter portion 1210a-n to at least one minor diameter portion 1212a-n. According to an embodiment, at least one of the abutment surfaces 1213 may comprise at least one semispherical shaped projection 1216 transversely extending from the abutment surface 1213 (FIG. 12B).

Each first and second head portions 1206 and 1207 may further comprise a thumb lock projection 1209 extending from a side surface of each head portion 1206 and 1207. According to an embodiment, the head portions 1206, 1207 may thereby comprise a drop cross sectional shape as shown in FIG. 12C. According to an embodiment, the standoff 1200 may comprise two thumb lock projections 1209, or a single thumb lock projection 1209 extending from one of the head portions. The thumb lock projections 1209 may extend beyond the diameter D12 of the major diameter portions 1210a-n (FIG. 12B) forming an extended abutment surface 1213a between the top major diameter portion 1210a and the top minor diameter portion 1212a. A semispherical lock projection 1216 may extend transversely from that extended abutment surface 1213a. The thumb lock projections 1209 are configured to be engaged by a user to turn the standoff 1200 about its longitudinal axis. However, each of the first and second head portions 1206 and 1207 may also comprise a drive portion 1208, such as drive portion 108 discussed above, shaped to receive a torque translating tool, such as a screwdriver, that may be alternatively used to turn the standoff 1200 about its longitudinal axis.

The standoff 1200 may further comprise an alignment mark 1217 disposed on the major diameter portions 1210a-n. According to an embodiment, the alignment mark 1217 may comprise a vertically extending channel on the side surfaces of the major diameter portions 1210a-n, orthogonal to the thumb lock projection 1209. However, other forms of alignment mark may be used.

FIGS. 13A-13B illustrate a method of interconnecting a plurality of boards 800a-n using the multiple board standoff 1200 of the present embodiments. Referring to FIG. 13A, the plurality of boards 800a-n are stacked one above another such that the keyhole slots 801 of the boards 800a-n are vertically aligned. The standoff 1200 is then aligned with the keyhole slots 801 such that the flat surfaces 1214 of the minor diameter portions 1212a-n are parallel with the side surfaces 807 of the reduced portion 804 of the keyhole slots 801. The standoff 1200 is then inserted into the keyhole slots 801 of the boards 800a-n such as each minor diameter portion 1212a-n of the standoff 1200 is inserted through a reduced portion 804 of a respective keyhole slot 801 of a board 800a-n. The standoff 1200 is inserted into the keyhole slots 801 of the boards 800a-n until each minor diameter portion 1212a-n of the standoff 1200 resides within the enlarged portion 805 of a respective keyhole slot 801 of each board 800a-n. Each board 800a-n is thereby positioned between respective major diameter portions 1210a-n of the standoff 100 and secured between abutment surfaces 1213.

The user may then engage the thumb lock projection 1209 of either the first head portion 1206 or the second head portion 1207 to rotate the standoff 1200 by about 90 degrees around its longitudinal axis as shown in FIGS. 13A-13B. Alternatively, the drive portion 1208 of the first head portion 1206 or the second head portion 1207 may be engaged with a torque translating tool, such as a screwdriver, and rotated by about 90 degrees. During rotation, each minor diameter portion 1212a-n of the standoff 1200 rotates within the enlarged portion 805 of a respective keyhole slot 801 of each board 800a-n.

As shown in FIG. 13B, after rotating the standoff 1200 by about 90 degrees, the boards 800a-n are vertically locked in between the major diameter portions 1210a-n via the abutment surfaces 1213. Additionally, the projection 1216 located on the extended abutment surface 1213a of the standoff 1200 (FIG. 12B) engages at least one depression 809 formed on the top board 800a. The projection 1216 and depression 809 prevents the standoff 1200 from rotating within the enlarged portions 805 of the keyhole slots 801 of the boards and dislodging from the boards. Additionally, after rotating the standoff 1200 by about 90 degrees, the alignment mark 1217 is aligned with the reduced portions 804 of the keyhole slots 801, between the side surfaces 807, to indicate that the standoff 1200 is positioned in a locked configuration. Accordingly, the plurality of boards 800a-n are secured above one another via standoff 1200.

INDUSTRIAL APPLICABILITY

To solve the aforementioned problems, the aspects of the embodiments are directed towards mounting hardware for printed circuit boards, and more specifically to a multiple board standoff for interconnecting a plurality of printed circuit boards. It should be understood that this description is not intended to limit the embodiments. On the contrary, the embodiments are intended to cover alternatives, modifications, and equivalents, which are included in the spirit and scope of the embodiments as defined by the appended claims. Further, in the detailed description of the embodiments, numerous specific details are set forth to provide a comprehensive understanding of the claimed embodiments. However, one skilled in the art would understand that various embodiments may be practiced without such specific details.

Although the features and elements of aspects of the embodiments are described being in particular combinations, each feature or element can be used alone, without the other features and elements of the embodiments, or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

The above-described embodiments are intended to be illustrative in all respects, rather than restrictive, of the embodiments. Thus the embodiments are capable of many variations in detailed implementation that can be derived from the description contained herein by a person skilled in the art. No element, act, or instruction used in the description of the present application should be construed as critical or essential to the embodiments unless explicitly described as such. Also, as used herein, the article "a" is intended to include one or more items.

Additionally, the various methods described above are not meant to limit the aspects of the embodiments, or to suggest that the aspects of the embodiments should be implemented following the described methods. The purpose of the described methods is to facilitate the understanding of one or more aspects of the embodiments and to provide the reader with one or many possible implementations of the processed discussed herein. The steps performed during the described methods are not intended to completely describe the entire process but only to illustrate some of the aspects discussed above. It should be understood by one of ordinary skill in the art that the steps may be performed in a different order and that some steps may be eliminated or substituted.

All United States patents and applications, foreign patents, and publications discussed above are hereby incorporated herein by reference in their entireties.

Alternate Embodiments

Alternate embodiments may be devised without departing from the spirit or the scope of the different aspects of the embodiments.

What is claimed is:

1. An electronic board mounting assembly comprising:
an electronic board comprising a keyhole slot having a reduced portion extending inwardly from a peripheral edge of the electronic board to an enlarged portion;
a standoff comprising a longitudinal body extending from a first terminal end to a second terminal end, the longitudinal body comprising:
a plurality of major diameter portions;
a plurality of minor diameter portions each disposed between two of the plurality of major diameter portions; and
a plurality of abutment surfaces each transversely extending from one of the major diameter portions to one of the minor diameter portions;
wherein at least one of the minor diameter portions is configured to be inserted through the reduced portion of the keyhole slot and into the enlarged portion of the keyhole slot when the standoff is in a first orientation with respect to the electronic board;
wherein the standoff is configured to be rotated to a second orientation with respect to the electronic board in which the at least one minor diameter portion cannot exit the enlarged portion of the keyhole slot through the reduced portion and the electronic board is retained by the standoff between at least two of the abutment surfaces.

2. The assembly of claim 1, wherein the standoff further comprises a head portion at the first terminal end or the second terminal end of the longitudinal body of the standoff.

3. The assembly of claim 2, wherein the head portion comprises a drive portion shaped to receive a torque translating tool that is used to rotate the standoff about its longitudinal axis.

4. The assembly of claim 3, wherein the drive portion comprises at least one of a single flat slot drive, a cross drive, a Phillips drive, a square drive, and a hex socket drive.

5. The assembly of claim 2, wherein the head portion comprises a thumb lock projection extending from a side surface thereof configured to be engaged by a user to rotate the standoff about its longitudinal axis.

6. The assembly of claim 5, wherein the head portion comprises a drop cross sectional shape.

7. The assembly of claim 5, wherein the thumb lock projection extends beyond a diameter of the major diameter portions.

8. The assembly of claim 5, wherein the thumb lock projection forms an extended abutment surface between a top major diameter portion and a top minor diameter portion.

9. The assembly of claim 8, wherein the electronic board comprises a depression proximate to the keyhole slot, and wherein the extended abutment surface comprises a projection configured for being received by the depression when the standoff is in the second orientation with respect to the electronic board to lock rotation between the standoff and the keyhole slot.

10. The assembly of claim 1, wherein at least one of the major diameter portions comprises an alignment mark that is aligned with the reduced portion of the keyhole slot when the standoff is at the second orientation with respect to the electronic board.

11. The assembly of claim 1, wherein the major diameter portions comprise identical lengths for interconnecting a plurality of electronic boards at identical distances.

12. The assembly of claim 1, wherein the major diameter portions comprise variable lengths for interconnecting a plurality of electronic boards at variable distances.

13. The assembly of claim 1, wherein each minor diameter portion comprises an obround shape defined by two parallel flat surfaces connected by two semicircular surfaces.

14. The assembly of claim 13, wherein each minor diameter portion comprises a first diameter between the two semicircular surfaces and a second diameter between the two parallel flat surfaces.

15. The assembly of claim 14, wherein the first and the second diameters are smaller than a diameter of the major diameter portions.

16. The assembly of claim 14, wherein the second diameter of each minor diameter portion is smaller than a diameter of the reduced portion of the keyhole slot.

17. The assembly of claim 16, wherein the first diameter of each minor diameter portion is larger than the diameter of the reduced portion of the keyhole slot.

18. The assembly of claim 17, wherein the first and the second diameters are smaller than a diameter of the enlarged portion of the keyhole slot.

19. The assembly of claim 18, wherein the diameter of the enlarged portion is larger than the diameter of the reduced portion of the keyhole slot.

20. The assembly of claim 13, wherein the enlarged portion of the keyhole slot comprises a semicircular shape.

21. The assembly of claim 1, wherein the electronic board comprises at least one depression proximate to the keyhole slot, and wherein at least one of the abutment surfaces comprises at least one projection configured for being received by the depression when the standoff is in the second orientation with respect to the electronic board to lock rotation between the standoff and the keyhole slot.

22. The assembly of claim 1, wherein the electronic board comprises at least one projection proximate to the keyhole slot, and wherein at least one of the abutment surfaces comprises at least one depression configured for receiving the projection when the standoff is in the second orientation with respect to the electronic board to lock rotation between the standoff and the keyhole slot.

23. The assembly of claim 1, wherein each of the minor diameter portions are configured for being received by keyhole slots of a plurality of electronic boards to interconnect the plurality of board in a stacked configuration.

24. A standoff for interconnecting a plurality of electronic boards each electronic board comprising a keyhole slot having a reduced portion extending inwardly from a peripheral edge of the electronic board to an enlarged portion, the standoff comprising:
a plurality of major diameter portions;
a plurality of minor diameter portions each disposed between two of the plurality of major diameter portions; and
a plurality of abutment surfaces each transversely extending from one of the major diameter portions to one of the minor diameter portions;
wherein at least one of the minor diameter portions is configured to be inserted through the reduced portion of the keyhole slot and into the enlarged portion of the keyhole slot when the standoff is in a first orientation with respect to the electronic board; and wherein the at least one minor diameter portion is configured to be retained within the enlarged portion of the keyhole slot when the standoff is in a second orientation with respect to the electronic board.

25. An electronic board mounting assembly comprising:
an electronic board comprising a keyhole slot having a reduced portion extending inwardly from a peripheral edge of the electronic board to an enlarged portion;
a standoff comprising a longitudinal body comprising:
  a plurality of major diameter portions;
  a plurality of minor diameter portions each disposed between two of the plurality of major diameter portions and each comprises:
    an obround shape defined by two parallel flat surfaces connected by two semicircular surfaces,
    a first diameter between the two semicircular surfaces, and
    a second diameter between the two parallel flat surfaces; and
  a plurality of abutment surfaces each transversely extending from one of the major diameter portions to one of the minor diameter portions;
wherein the first diameter of each minor diameter portion is larger than a diameter of the reduced portion of the keyhole slot and wherein the second diameter of each minor diameter portion is smaller than the diameter of the reduced portion of the keyhole slot;
wherein at least one minor diameter portion of the standoff is inserted into the keyhole slot of the electronic board to retain the electronic board between at least two of the abutment surfaces.

* * * * *